(12) United States Patent
Zhang et al.

(10) Patent No.: US 6,509,609 B1
(45) Date of Patent: Jan. 21, 2003

(54) GROOVED CHANNEL SCHOTTKY MOSFET

(75) Inventors: Yaohui Zhang, Los Angeles, CA (US); Bich-Yen Nguyen, Austin, TX (US); Kuntal Joardar, Chandler, AZ (US); Daniel Thanh-Khac Pham, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/884,345

(22) Filed: Jun. 18, 2001

(51) Int. Cl.$^7$ .......................... H01L 29/78; H01L 27/092

(52) U.S. Cl. .................. 257/330; 257/369; 257/384; 257/407; 257/412; 257/476

(58) Field of Search ................................ 257/330, 369, 257/384, 407, 412, 476

(56) References Cited

U.S. PATENT DOCUMENTS

| | | | |
|---|---|---|---|
| 5,031,006 A | | 7/1991 | Meignant .................. 357/15 |
| 5,672,898 A | * | 9/1997 | Keller et al. ............... 257/384 |
| 5,883,418 A | * | 3/1999 | Kimura ..................... 257/412 |
| 5,994,736 A | * | 11/1999 | Sugawara et al. ......... 257/330 |
| 6,118,161 A | | 9/2000 | Chapman et al. ......... 257/401 |
| 6,130,454 A | * | 10/2000 | Gardner et al. ........... 257/330 |
| 6,218,690 B1 | * | 4/2001 | Kim et al. ................. 257/384 |
| 6,323,525 B1 | * | 11/2001 | Noguchi et al. .......... 257/385 |

OTHER PUBLICATIONS

"A new type of mos–gated tunnel transistor with a schottky barrier," M. Kimura, Microelectronics and VLSI, 1995 IEEE, pp. 387–390.

"Two dimensional carrier profiling of a 0.4 um CMOS device by schottky SCM," J.N. Nxumalo et al., Reliability Physics Symposium Proceedings, 1999. pp 310–314.

"Characterization of shallow silicided junctions for sub–quarter micron ULSI technology—Extraction of silicidation induced schottky contact area," H. Lee, IEEE Transactions on Electron Devices, vol. 47, No. 4, Apr. 2000, pp. 762–767.

"Sub–50 nm PtSi schottky source/drain p–MOSFETs," C. Wang et al., Device Research Conference Digest, 1998, pp 72–73.

"35 nm metal gat SOI–p–MOSFETs with PtSi schottky source/drain," W. Saitoh et al. Device Research Confernce Digest, 1999, pp 30–31.

"Schottky–clamped NMOS transistors implemented in a conventional 0.8–/spi mu/m CMOS process," F. Huang, IEEE Electron Device Letters, bol. 19, issue 9, Sep. 1998, pp. 326–328.

"Comparison of a raised and schottky source/drain MOSFETs using a novel tunneling contact model," M. Ieong et al., IEDM '98 Technical Digest, International, 1998, pp. 733–736.

Two–dimensional numerical simulation schottky barrier MOSFET with channel length to 10 nm, C. Huang et al., IEEE Transactions on Electron Devices, vol. 45, No. 4, Apr. 1998, pp. 842–848.

(List continued on next page.)

Primary Examiner—Gene M. Munson

(57) ABSTRACT

A grooved channel Schottky contacted MOSFET has asymmetric source and drain regions. The MOSFET includes an undoped silicon substrate with a background doping concentration of less than about $10^{17}$ cm$^{-3}$. A grooved channel is formed in a first surface of the substrate. A first metal silicide material is formed in a first side of the grooved channel, forming a source region, and a second metal silicide material is formed on a second side of the grooved channel, forming a drain region. A metal gate is formed in the grooved channel. The grooved structure allows the off-state current to be reduced to less than 50 pA/$\mu$m. Further, the feature size can be scaled down to 10 nm without strong short-channel effects (DIBL<0.063) and the gate delay (CV/I) is reduced to 2.4 ps.

20 Claims, 3 Drawing Sheets

OTHER PUBLICATIONS

Pt–silicide source and drain SOI–MOSFET operating in bi–channel modes, M. Nishisaka, Device Research Confernce Digest, 1998, pp. 74–75.

"Metal –oxide semiconductor field–effect transistors using schottky barrier drains," F. Huang et al., Electronics Letters, vol. 33, Issue 15, Jul. 1997, pp. 1341–1342.

* cited by examiner

GROOVED CHANNEL SCHOTTKY MOSFET

BACKGROUND OF THE INVENTION

The present invention relates to integrated circuits and more particularly to a grooved channel Schottky contacted MOSFET and a method for making a grooved channel Schottky contacted MOSFET.

In order to more highly integrate electronic circuits, a great deal of research has been focused on small geometry transistors. A Schottky contacted MOSFET has been proposed to eliminate the scaling issues of conventional CMOS. A Schottky contacted MOSFET uses Schottky junctions to replace the conventional heavily-doped p-n homojunctions within the source and drain regions. Metal silicides are used to form natural Schottky barriers to silicon substrates that confine the carriers, reducing or eliminating the need for dopant impurities in the channel to prevent current flow in the "off" condition.

Such Schottky contacted MOSFETs are turned on by large gate-induced electric fields at the top of the source region that result in narrowing of the Schottky barrier width and then enhancing the carrier tunneling into the silicon channel. Schottky contacted MOSFETs have the advantage that there is no punch-through because the source barrier is determined by the Schottky barrier itself. Further, random dopant location issues have been eliminated and the external resistance components in the source and drain regions can be reduced because metal silicides directly contact the silicon channel. Therefore, the fabrication of Schottky contacted MOSFETs is more simple than conventional CMOS structures.

Such Schottky contacted MOSFETs still have some drawbacks that prevent their application in logic VLSI and analog circuits. The most important drawback is that the off-state current, which is more than $10^{-8}$ A/$\mu$m, is too large to be used in conventional circuits. Unfortunately, optimizing the design parameters, such as barrier height and background doping, cannot eliminate this drawback.

Another drawback of the Schottky contacted MOSFETs is that they cannot be scaled to less than 30 nm due to severe short-channel effects. As the gate length of a planar Schottky MOSFET is reduced to less than 0.05 $\mu$m, the short-channel effects become quite severe. Referring to FIG. 11, a graph of drain current versus gate voltage of a planar Schottky MOSFET having a gate length of 20 nm is shown. Curves 400, 402 and 404 illustrate the device operating at drain voltages of 0.75 v, 0.35 v and 0.1 v, respectively. As can be seen for this device, the threshold voltage decreases as the drain voltage (Vds) increases. In the meantime, the off-state current increases, which is similar to the punch-through effect in conventional CMOS devices. These characteristics prevent conventional Schottky contacted MOSFETs from use in commercial applications, such as logic VLSI and analog integrated circuits.

It is an object of the present invention to provide a Schottky contacted MOSFET suitable for VLSI and analog circuit applications.

SUMMARY OF THE INVENTION

In order to provide a Schottky contacted MOSFET that is suitable for VLSI and analog circuit applications, the present invention provides a grooved channel Schottky contacted MOSFET with a metal gate and asymmetric Schottky contacted source and drain regions.

In a first embodiment, the invention provides a semiconductor device including a silicon substrate having a grooved channel formed in a first surface thereof. A first metal silicide material is formed on the first surface on a first side of the grooved channel, which defines a source region. A second metal silicide material is formed on the first surface on a second side of the grooved channel, which defines a drain region. A metal gate is formed in the grooved channel.

In accordance with the invention, a N-channel grooved Schottky MOSFET includes an undoped silicon or P-doped silicon substrate having a background doping concentration of less than about $10^{17}$ cm$^{-3}$. A grooved channel is formed in a first surface of the substrate. A PtSi layer is formed on the first surface on a first side of the grooved channel, which defines a source region. An ErSi layer is formed on the first surface on a second side of the grooved channel, which defines a drain region. A gate made of TiSi$_2$ is formed in the grooved channel. The gate has a length of about 0.03 um or less. An off-state current of the MOSFET is less than about 50 pA/um and an on-state current is greater than about 200 uA/um.

The invention further provides a P-channel grooved Schottky MOSFET including an undoped silicon or N-doped silicon substrate having a background doping concentration of less than about $10^{17}$ cm$^{-3}$. A grooved channel is formed in a first surface of the substrate. An ErSi layer is formed on the first surface on a first side of the grooved channel, which defines a source region and a PtSi layer is formed on the first surface on a second side of the grooved channel, which defines a drain region. A metal gate is formed in the grooved channel. The gate is made of a metal having a work function of about 5.0 eV and a gate length of less than about 0.03 um. An off-state current of the MOSFET is less than about 50 pA/um and an on-state current is greater than about 200 uA/um.

The present invention also provides a method of fabricating a grooved channel Schottky contacted MOSFET including the steps of:

providing an undoped silicon substrate having a background doping concentration of less than $10^{17}$ cm$^{-3}$;

forming an isolation trench in a first surface of the substrate;

depositing a thin oxide film on the first surface of the substrate;

depositing a thin nitride film over the thin oxide film;

forming first and second grooved channels in the first surface of the substrate wherein the first and second grooved channels are formed on opposing sides of the isolation trench;

forming a first metal gate in the first grooved channel and a second metal gate in the second grooved channel;

depositing a first metal on the first surface of the substrate on first sides of the first and second channels, the first sides being located between the isolation trench and the first and second channels, respectively, and annealing the first metal to form a first metal silicide, thereby defining a drain of a p-channel device and a source of a n-channel device; and depositing a second metal on the first surface of the substrate on second sides of the first and second channels, the second sides opposing the first sides, and annealing the second metal to form a second metal silicide, thereby defining a source of the p-channel device and a drain of the n-channel device.

Figure 1:
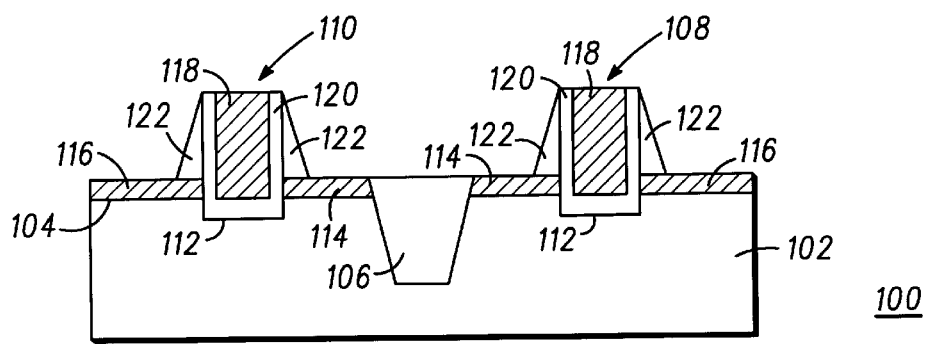
FIG. 1 is an enlarged cross-sectional view of a grooved channel Schottky MOSFET in accordance with the present invention.

Those skilled in the art will appreciate that elements in the figures are illustrated for simplicity and clarity and have not necessarily been drawn to scale.

DETAILED DESCRIPTION OF PREFERRED EMBODIMENTS

The detailed description set forth below in connection with the appended drawings is intended as a description of the embodiments of the invention, and is not intended to represent the only forms in which the present invention may be practiced. It is to be understood that the same or equivalent functions may be accomplished by different embodiments that are intended to be encompassed within the spirit and scope of the invention. In the drawings, like numerals are used to indicate like elements throughout.

Referring now to FIG. 1, an enlarged, cross-sectional view of a grooved channel CMOS device 100 with asymmetric source and drain Schottky contacts is shown. The device 100 has a doped or undoped silicon substrate 102 having a first surface 104. That is, the background doping of the silicon substrate 102 should be less than about $10^{17}$ cm$^{-3}$. An isolation trench 106 is formed in the substrate 102 and separates a P-channel device 108 and an N-channel device 110. The background dopant of the P-channel device 108 is preferably Phosphorous and the background dopant of the N-channel device 110 is preferably Boron. The isolation trench 106 is formed in a conventional manner. Those of ordinary skill in the art understand substrate background doping and isolation channel formation.

A grooved channel 112 is formed in the first surface 104 of the substrate 102. For the P-channel device 108, a first metal silicide material 114 is formed on the first surface 104 on a first side of the grooved channel 112. The first metal silicide material 114 forms a source region of the P-channel device 108. A second metal silicide material 116 is formed on the first surface 104 on a second side of the grooved channel 112. The second metal silicide material 116 forms a drain region of the P-channel device 108.

For the N-channel device 110, the first metal silicide material 114 is formed on the first surface 104 on a first side of the grooved channel 112 and in this instance, forms a drain region of the N-channel device 110. The second metal silicide material 116 is formed on the first surface 104 on a second side of the grooved channel 112 and forms a source region of the N-channel device 110.

In this embodiment, the first metal silicide material 114 comprises ErSi and the second metal silicide material 116 comprises PtSi. Thus, the drain of the N-channel device 110 and the source of the P-channel device 108 are formed of ErSi while the source of the N-channel device 110 and the drain of the P-channel device 108 are formed of PtSi.

A metal gate 118 is formed in the grooved channel 112. A high K dielectric 120 is located between the gate 118 and the substrate 102. In this embodiment, the high K dielectric 120 is an oxide layer. The high K dielectric 120 substantially surrounds the metal gate 118 and separates the metal gate 118 from the substrate 102 and the first and second metal silicides materials 114, 116. For a device 108, 110 having a gate length of about 30 nm, the high K dielectric 120 has an equivalent thickness to SiO$_2$ of about 1.0 nm or thinner and the grooved channel 112 has a depth of about 5.0 nm below an interface of the substrate 102 and the metal silicide materials 114, 116. That is, the interface of the metal silicide material 114, 116 and the substrate 102 is located about 5.0 nm above the interface of the high K dielectric 120 and the substrate 102.

The metal gates 118 of the P-channel and N-channel devices 108, 110 are made of different metals in order to achieve a desired predetermined voltage control. The metal gates 118 preferably comprise metal materials that have a work function within about 0.3 to 0.4 eV from the conduction band or above a mid-gap for the N-channel device 110 and about 0.3 to 0.4 eV from the valence band or below the mid-gap for the P-channel device 108. For example, the metal gate 118 of the N-channel device 110 is preferably a metal material having a work function of about 4.1 eV, such as TiSi$_2$, which has a work function of 4.245 eV, while the metal gate 118 of the P-channel device 108 preferably comprises a metal material having a work function of about 5.045 eV, such as tungsten nitride (WNx). For the N-channel device 110, other preferred metal materials have a work function within about 0.2 eV from the conduction band (4.1 eV), such as TaN and Mo. For the P-channel device 108, other preferred metal materials have a work function within about 0.2 ev from the valence band, such as Pt and Ir.

A sidewall layer 122 is formed on the sides of the metal gates 118. The thickness of the sidewall layer 122 is controlled to allow lateral extension of the metal silicide 114, 116 to extend to the high K dielectric 120. The sidewall layer is preferably formed of Si$_3$N$_4$.

The Schottky contacted MOSFETs are turned on by a large gate induced electrical field at the source contact, which induces internal field emission via Fowler-Nordheim tunneling through the sources Schottky barrier to the grooved channel 112 with a tunneling barrier width of about 5.0 nm. A groove depth of about 5.0 nm effectively screens the effect of the electric field from the drain to the source, which eliminates short-channel effects. Although the physical channel length of the grooved MOSFET is the planar gate length plus two times the depth of the groove 112, the effective gate length is equal to the planar gate length if the depth of the groove is less than 5.0 nm, which is close to the tunneling barrier width in the source, assuming Vgs=Vdd and Vds=Vdd. This does not degrade the drive current significantly. Simulation results of this device structure show that the gate delay (CV/I) of the NMOS device 110 is about 2.4 ps and the gate delay of the PMOS device 108 is about 4.6 ps.

The off-state current includes electron current and hole current. Therefore, large Schottky barrier heights to electrons and holes are needed in order to achieve a very low off-state current. Thus asymmetric source/drain contacts are preferred. PtSi and ErSi yield about a 0.9 V of barrier height to electrons and to holes, respectively. Another advantage of asymmetric source/drain contacts is to let the drain effectively sink channel current for increasing on-state current. For example, ErSi (PtSi) in the drain of the NMOS device 110 (PMOS device 108) has only 0.25 V of barrier height for electrons (holes).

Figure 7:
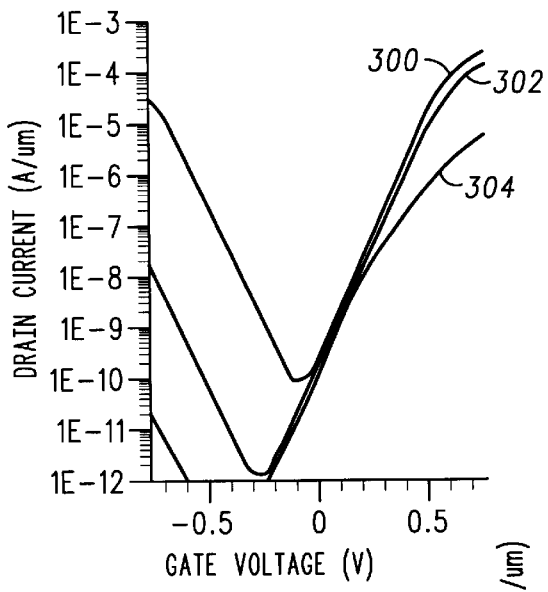
FIGS. 7–10 are graphs illustrating drain current versus gate voltage of various sized devices of the present invention.
Figure 8:
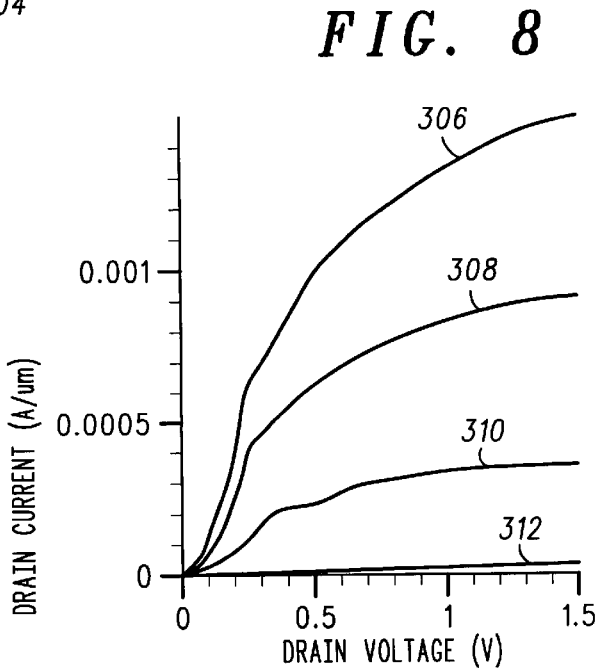

Referring now to FIGS. 7–10, these graphs show the characteristics of a semiconductor device in accordance with the present invention. FIG. 7 shows the transfer characteristics for three different drain voltages. Curves 300, 302 and 304 illustrate the transfer characteristics when the semiconductor device has drain-to-source voltages Vds of 0.75V, 0.38V and 0.01V, respectively. FIG. 8 shows drain current versus drain voltage as a function of gate voltage. Curves 306, 308, 310 and 312 illustrate gate-to-source voltages Vgs of 1.25V, 1.0V, 0.75V and 0.50V, respectively. As can be seen, the short-channel effects are not very strong and Drain Induced Barrier Lowering (DIBL) is 0.063.

Figure 9:
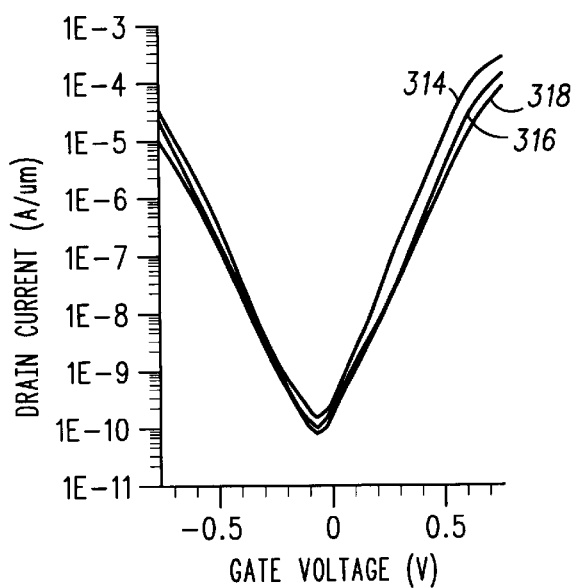
Figure 10:
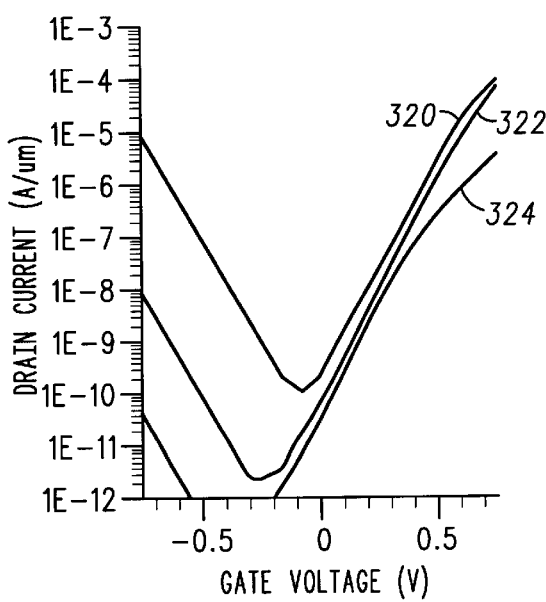
Figure 11:
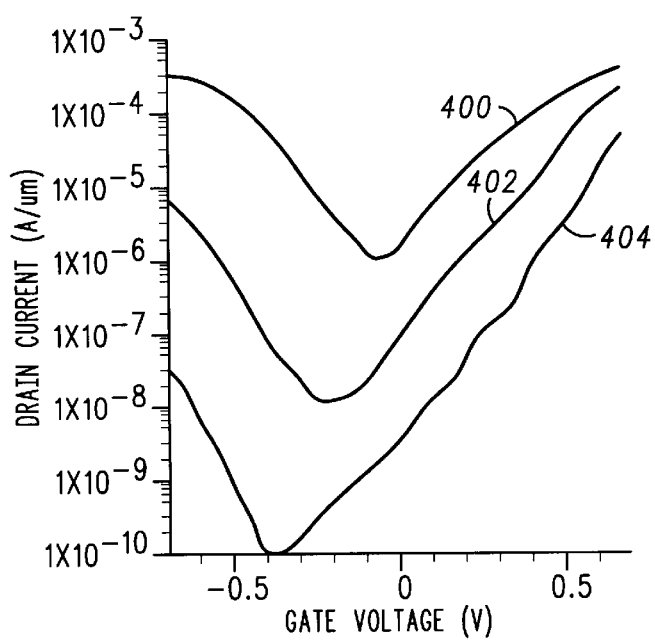
FIG. 11 is a graph of drain voltage versus threshold voltage of a prior art planar Schottky contacted MOSFET.

Further, there is a saturation region in the output characteristics. The proposed Schottky MOSFET structure can reduce the off-state current to less 50 pA/$\mu$m, while the on-state current exceeds more 200 $\mu$A/$\mu$m. FIG. 9 shows the transfer characteristics of a grooved channel Schottky MOSFET in accordance with the present invention. Curves 314, 316 and 318 illustrate drain currents for devices having gate lengths Lg of 0.03 $\mu$m, 0.02 $\mu$m and 0.0 $\mu$m, respectively. The characteristics of these three devices are very close, which implies that the Schottky MOSFET structure of the present invention can be scaled down to 0.01 $\mu$m. FIG. 10 shows the transfer characteristics for a device having a gate length of 10 nm (Lg=0.01 $\mu$m). Curves 320, 322 and 324 illustrate the device for drain voltages Vds of 0.75V, 0.35V and 0.01V, respectively. The DIBL is 0.14 and the short-channel effect still is not very strong.

Table 1 summarizes the materials used in the preferred embodiment of the invention.

TABLE 1

|  | N-channel MOSFET | P-channel MOSFET |
|---|---|---|
| Gate | TiSi$_2$ (work func. = 4.245 eV) | WNx (work func. = 5.045 eV) |
| Source | PtSi | ErSi |
| Drain | ErSi | PtSi |
| Substrate | <10$^{17}$ cm$^{-3}$ | <10$^{17}$ cm$^{-3}$ |

In the grooved channel device architecture of the present invention, the difference between NMOS and PMOS devices is in the substrate and the metal gate. There is no difference in source/drain, as the two metal silicides are just exchanged. The grooved channel structure has the advantage of allowing the off-state current to be reduced to less than 50 pA/$\mu$m. Further, the device feature size can be scaled down to about 10 nm without strong short-channel effects (DIBL <0.063). In addition, the gate delay (CV/I) is reduced to about 2.4 ps. The device structure of the present invention can be used in high-speed logic VLSI and analog integrated circuits.

Referring now to FIGS. 2–6, a method of preparing a semiconductor integrated circuit is shown. An integrated circuit, such as a CMOS device, according to the present invention can be manufactured using only five masks. The first mask is used to pattern the shallow trench isolation and the active region. The second mask is used to etch silicon forming the grooved N-channel and to deposit the gate dielectric and metal. The third mask is used to etch silicon forming the grooved P-channel and deposit the gate dielectric and metal. The same silicides can be used for both n- and p-channel devices, facilitating integration. Then, a sidewall layer is deposited. The fourth mask is used to define the silicide for the source of the NMOS device and the drain of the PMOS device. Finally, the fifth mask is used to define the silicide for the drain of the NMOS device and the source of the PMOS device.

Figure 2:
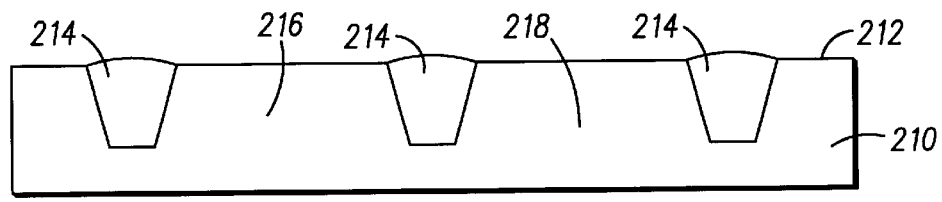
FIGS. 2–6 illustrate different stages of the fabrication process of a grooved channel Schottky MOSFET in accordance with the present invention.

Referring particularly to FIG. 2, a MOSFET device is formed using a doped or an undoped silicon substrate 210 having a first surface 212. As discussed above, a doped silicon substrate having a background doping concentration of less than about 10$^{17}$ cm$^{-3}$ can also be used. One or more isolation trenches 214 are formed in the first surface 212 of the substrate 210 and separate P-channel areas 216 from N-channel areas 218. The P-channel area 216 is preferably doped with Phosphorous and the N-channel area 218 is preferably doped with Boron. However, other dopants known to those of skill in the art could be used. The isolation trenches 214 are formed in a conventional manner.

Figure 3:
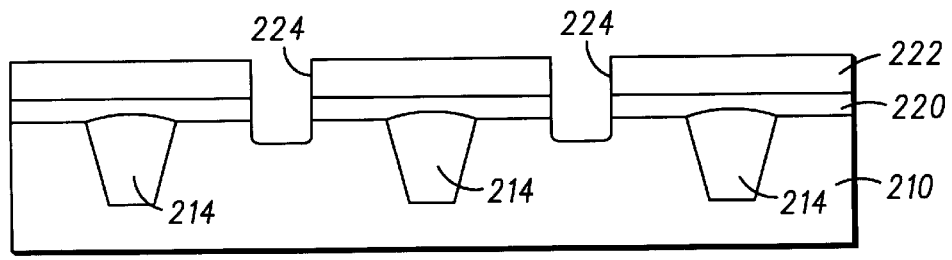

A thin oxide film 220 is deposited on the first surface 212 of the substrate 210 and a thin nitride film 222 is deposited over the thin oxide film 220, as shown in FIG. 3. The oxide film 220 preferably has a thickness of about 12 nm and the nitride film 222 preferably has a thickness of about 100 nm. The oxide and nitride films 220, 222 are then patterned and etched and the substrate 210 is etched using the oxide and nitride films 220, 222 as a hard mask. In this manner, grooved channels 224 are formed in the substrate 210. The grooved channels 224 preferably extend about 0.05 um or more below the first surface 212 of the substrate 210. Thus, a grooved channel device, as opposed to a planar device, will be formed. The channels 224 are formed on opposing sides of the isolation trenches 214.

Figure 4:
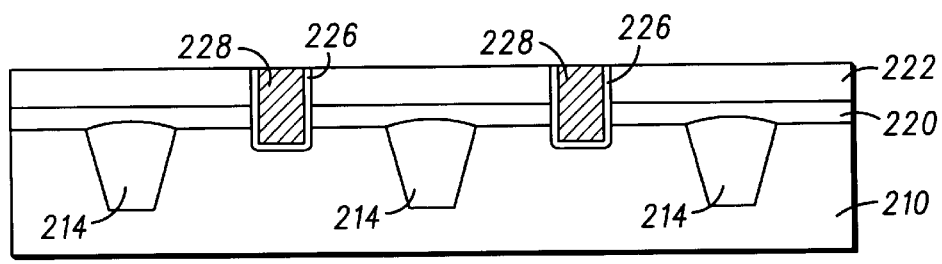

Referring now to FIG. 4, a high K dielectric material 226 and a gate dielectrode material 228 are grown or deposited in the grooved channels 224. In this embodiment, the high K dielectric material 226 is an oxide layer having a thickness of about 0.01 um. As discussed above, preferably the gate dielectrode material 228 of the P-channel and N-channel devices are made of different metals. For example, the gate dielectrode material 228 of the N-channel device is preferably TiSi$_2$ and the gate dielectrode material 228 of the P-channel device is preferably WNx. The gate dielectric and dielectrode materials 226, 228 are chemically and mechanically polished and then dry or wet etched. If a dual work function gate material is required, then an additional mask is required to form the N-channel and P-channel gate electrodes by repeating the growing or depositing of another dielectrode material, as will be understood by those of ordinary skill in the art.

Figure 5:
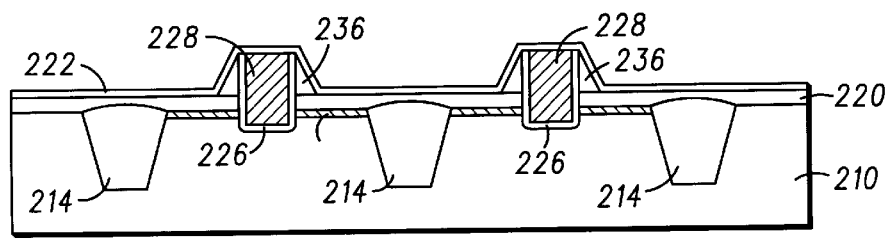

After the metal gates (dielectrode material 228) are formed, the nitride film 222 is etched using anisotropic etch stop on the oxide film 220 to form a nitride spacer. The thickness of sidewall layers 236 (FIG. 5) is strictly controlled to allow lateral extension of silicide to reach the gate dielectric 226 when a silicide annealing process is performed, while preventing damage to the gate dielectrode material 228. Another option to form a thinner nitride spacer is to remove the nitride 222 by using either dry or wet etching, depending on the gate dielectric and gate electrode materials 226, 228, until just a thin layer of the oxide film 220 remains, such as to a thickness of about 10 nm as shown in FIG. 5. Then a thinner layer of nitride is deposited using the anisotropic etch to form a narrower nitride spacer. The drain of the P-channel device and the source of the N-channel device are then defined by patterning. The thin oxide is removed by dry etch or wet etch.

Figure 6:
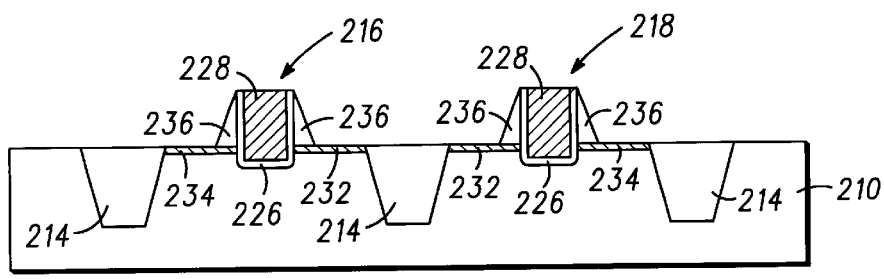

Referring now to FIG. 6, after stripping the photo resist, a first metal is deposited on the first surface 212 of the substrate 210. The drain of the P-channel device is located between one of the isolation trenches 214 and one of the grooved channels 224 at the P-channel area 216. Similarly, the source of the N-channel device is located between one of the isolation trenches 214 and one of the grooved channels 224 at the N-channel area 218. The first metal is then annealed to form a first metal silicide 232, which forms a drain of the P-channel device and a source of the N-channel device. Any unreacted first metal is removed, such as by selective wet etching. A second thermal anneal for silicide may be used to reduce resistance.

The oxide film 220 is removed by wet etching. Then, after the etching of the oxide film 220, a second metal is deposited on the first surface 212 of the substrate 210. More specifically, the second metal is deposited on opposing sides of the channels 224 as the first metal was deposited. The second metal is then annealed to form a second metal silicide 234, which forms a source of the P-channel device and a drain of the N-channel device. Any unreacted second metal is removed, such as by etching. A second thermal anneal might be needed to reduce the resistance of the silicide layer.

In this embodiment, the first metal comprises Pt and the second metal comprises Er, so that the first metal silicide is PtSi and the second metal silicide is ErSi. It is possible to use one metal, such as Pt, instead of two different metals, when forming the source and drain regions, however, using the same metal material affects the device offset current. That is, using different metals, such as Pt and Er, provides a lower offset current.

As is apparent, the present invention provides a grooved Schottky MOSFET structure and a method of fabricating a device with such a structure. As will be appreciated, other metals and materials having properties similar to those described with reference to the preferred embodiment may be used. Thus, the present invention is not limited to using PtSi, ErSi, WNx and TiSi$_2$. It is understood, therefore, that this invention is not limited to the particular embodiments disclosed, but covers modifications within the spirit and scope of the present invention as defined by the appended claims.

What is claimed is:

1. A semiconductor device comprising:
   a silicon substrate having a grooved channel formed in a first surface of the substrate;
   a first metal silicide material formed on the first surface on a first side of the grooved channel and forming a source region;
   a second metal silicide material different from the first material formed on the first surface on a second side of the grooved channel and forming a drain region; and
   a metal gate formed in the grooved channel.

2. The semiconductor device of claim 1, wherein the grooved channel has a depth that is greater than about 5.0 nm below an interface of the first and second metal silicide materials and the substrate.

3. The semiconductor device of claim 1, wherein the silicon substrate comprises silicon with a background p-doping concentration of less than about $10^{17}$ cm$^{-3}$.

4. The semiconductor device of claim 3, wherein the background dopant is Boron.

5. The semiconductor device of claim 3, wherein the first metal silicide material comprises PtSi.

6. The semiconductor device of claim 5, wherein the second metal silicide material comprises ErSi.

7. The semiconductor device of claim 6, wherein the gate comprises TiSi$_2$.

8. The semiconductor device of claim 6, wherein the metal gate comprises a material having a work function within about 0.4 ev of a conduction band thereof.

9. The semiconductor device of claim 1, wherein the gate has a length of about 0.03 um or less.

10. The semiconductor device of claim 1, wherein an off-state current is less than about 50 pA/um and the on-state current is greater than about 200 uA/um.

11. The semiconductor device of claim 1, wherein the silicon substrate has a background n-doping concentration of less than about $10^{17}$ cm$^{-3}$.

12. The semiconductor device of claim 11, wherein the background dopant is Phosphorous.

13. The semiconductor device of claim 11, wherein the first metal silicide material comprises ErSi.

14. The semiconductor device of claim 13, wherein the second metal silicide material comprises PtSi.

15. The semiconductor device of claim 14, wherein the gate comprises WNx.

16. The semiconductor device of claim 14, wherein the metal gate comprises a material having a work function within about 0.4 ev of a valence band thereof.

17. The semiconductor device of claim 1, further comprising a high K dielectric located between the gate and the substrate.

18. The semiconductor device of claim 17, wherein the high K dielectric comprises an oxide layer.

19. A N-channel grooved Schottky metal oxide semiconductor field effect transistor (MOSFET), comprising:
   a silicon substrate having a grooved channel formed in a first surface thereof and a background doping concentration of less than about $10^{17}$ cm$^{-3}$;
   a first metal silicide material formed on the first surface on a first side of the grooved channel and forming a source region, the first silicide material comprising PtSi;
   a second metal silicide material formed on the first surface on a second side of the grooved channel and forming a drain region, the second silicide material comprising ErSi; and
   a metal gate formed in the grooved channel, the gate comprising TiSi$_2$, wherein the gate has a length of about 0.03 um or less, and wherein an off-state current is less than about 50 pA/um and an on-state current is greater than about 200 uA/um.

20. A P-channel grooved Schottky metal oxide semiconductor field effect transistor (MOSFET), comprising:
   a silicon substrate having a grooved channel formed in a first surface thereof and a background doping concentration of less than about $10^{17}$ cm$^{-3}$;
   a first metal silicide material formed on the first surface on a first side of the grooved channel and forming a source region, the first metal silicide material comprising ErSi;
   a second metal silicide material formed on the first surface on a second side of the grooved channel and forming a drain region, the second metal silicide material comprising PtSi; and
   a metal gate formed in the grooved channel, the gate comprising WNx and having a length of less than about 0.03 um and wherein an off-state current is less than about 50 pA/um and an on-state current is greater than about 200 uA/um.

* * * * *